(12) United States Patent
Bringivijayaraghavan

(10) Patent No.: US 8,509,011 B2
(45) Date of Patent: Aug. 13, 2013

(54) COMMAND PATHS, APPARATUSES, MEMORIES, AND METHODS FOR PROVIDING INTERNAL COMMANDS TO A DATA PATH

(75) Inventor: Venkatraghavan Bringivijayaraghavan, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 230 days.

(21) Appl. No.: 13/093,640

(22) Filed: Apr. 25, 2011

(65) Prior Publication Data
US 2012/0269015 A1 Oct. 25, 2012

(51) Int. Cl.
*G11C 7/00* (2006.01)

(52) U.S. Cl.
USPC .... 365/194; 365/93; 365/189.05; 365/233.11

(58) Field of Classification Search
USPC ............... 365/194, 93, 189.05, 233.11
See application file for complete search history.

(56) References Cited

U.S. PATENT DOCUMENTS

| | | | |
|---|---|---|---|
| 6,219,384 B1 | 4/2001 | Kliza et al. |
| 6,260,128 B1 | 7/2001 | Ohshima et al. |
| 6,438,055 B1 | 8/2002 | Taguchi et al. |
| 6,510,095 B1 | 1/2003 | Matsuzaki et al. |
| 6,687,185 B1 | 2/2004 | Keeth et al. |
| 6,744,285 B2 | 6/2004 | Mangum et al. |
| 6,973,008 B2 | 12/2005 | Krause |
| 6,980,479 B2 | 12/2005 | Park |
| 6,988,218 B2 | 1/2006 | Drexler |
| 7,042,799 B2 | 5/2006 | Cho |
| 7,058,799 B2 | 6/2006 | Johnson |
| 7,170,819 B2 | 1/2007 | Szczypinski |
| 7,187,599 B2 | 3/2007 | Schnell et al. |
| 7,209,396 B2 | 4/2007 | Schnell |
| 7,269,754 B2 | 9/2007 | Ramaswamy et al. |
| 7,280,430 B2 | 10/2007 | Lee |
| 7,340,632 B2 | 3/2008 | Park |
| 7,375,560 B2 | 5/2008 | Lee et al. |
| 7,451,338 B2 | 11/2008 | Lemos |
| 7,631,248 B2 | 12/2009 | Zakharchenko et al. |
| 7,656,745 B2 | 2/2010 | Kwak |
| 7,660,187 B2 | 2/2010 | Johnson et al. |
| 7,663,946 B2 | 2/2010 | Kim |
| 7,671,648 B2 | 3/2010 | Kwak |
| 7,716,510 B2 | 5/2010 | Kwak |

(Continued)

OTHER PUBLICATIONS

Related U.S. Appl. No. 13/074,972, filed Mar. 29, 2011.

(Continued)

*Primary Examiner* — Jason Lappas
(74) *Attorney, Agent, or Firm* — Dorsey & Whitney LLP

(57) ABSTRACT

Command paths, apparatuses, memories, and methods for providing an internal command to a data path are disclosed. In an example method, a command is received and propagated through a command path to provide an internal command. Further included in the method is determining a difference between a latency value and a path delay difference, the path delay difference representing a modeled path delay difference between the command path and the data path measured in terms of a number of clock periods. The propagation of the command through the command path to the data path is delayed by a delay based at least in part on the difference between the latency value and the path delay difference. The internal command is provided to the data path responsive to an internal clock signal.

20 Claims, 7 Drawing Sheets

(56) References Cited

U.S. PATENT DOCUMENTS

| | | | |
|---|---|---|---|
| 7,751,261 | B2 | 7/2010 | Cho |
| 7,773,435 | B2 | 8/2010 | Cho |
| 7,826,305 | B2 | 11/2010 | Fujisawa |
| 7,872,924 | B2 | 1/2011 | Ma |
| 7,913,103 | B2 | 3/2011 | Gold et al. |
| 7,948,817 | B2 | 5/2011 | Coteus et al. |
| 7,969,813 | B2 | 6/2011 | Bringivijayaraghavan et al. |
| 2001/0015924 | A1 | 8/2001 | Arimoto et al. |
| 2003/0117864 | A1 | 6/2003 | Hampel et al. |
| 2006/0155948 | A1 | 7/2006 | Ruckerbauer |
| 2007/0033427 | A1 | 2/2007 | Correale, Jr. et al. |
| 2007/0088903 | A1* | 4/2007 | Choi .................. 711/100 |
| 2008/0080271 | A1 | 4/2008 | Kim |
| 2009/0315600 | A1 | 12/2009 | Becker et al. |
| 2010/0001762 | A1 | 1/2010 | Kim |
| 2010/0165769 | A1 | 7/2010 | Kuroki |
| 2010/0165780 | A1 | 7/2010 | Bains et al. |
| 2010/0195429 | A1 | 8/2010 | Sonoda |
| 2010/0254198 | A1 | 10/2010 | Bringivijayaraghavan et al. |
| 2011/0055671 | A1 | 3/2011 | Kim et al. |
| 2011/0228625 | A1 | 9/2011 | Bringivijayaraghavan |
| 2011/0238941 | A1 | 9/2011 | Xu et al. |

OTHER PUBLICATIONS

Related U.S. Appl. No. 13/364,198, filed Feb. 1, 2012.
Related U.S. Appl. No. 13/486,674, filed Jun. 1, 2012.
Related U.S. Appl. No. 13/531,341, filed Jun. 22, 2012.
Related U.S. Appl. No. 13/543,698, filed Jul. 6, 2012.
Notificiation of International Search Report and Written Opinion dated May 7, 2012 for International Application No. PCT/US2012/027672, May 7, 2012, 1-9.
"Interfacing DDR SDRAM with Stratix II Devices", Version 3.2, Altera Corp, Sep. 2008.
Lee, "How to Implement DDR SGRAM in Graphic System", Samsung Electric, 1998.

\* cited by examiner

US 8,509,011 B2

COMMAND PATHS, APPARATUSES, MEMORIES, AND METHODS FOR PROVIDING INTERNAL COMMANDS TO A DATA PATH

TECHNICAL FIELD

Embodiments of the invention relate generally to semiconductor memory, and more specifically, in one or more described embodiment, to timing internal clock, data, and command signals for executing memory commands in a high-speed memory clock system.

BACKGROUND OF THE INVENTION

In semiconductor memory, proper operation of the memory is based on the correct timing of various internal command, data, and clock signals. For example, in writing data to memory internal clock signals that clock data path circuitry to latch write data may need to be provided with specific timing relationships with internal write command signals to properly enable the data path circuitry to provide the latched write data for writing to memory. If the timing of the internal write command signal is not such that the data path circuitry is enabled at the time the internal clock signal clocks the data path circuitry to provide the write data at an expected time, the write command may be inadvertently ignored or the write data provided to the memory may not be correct (e.g., the write data is associated with another read command).

Moreover, as known, a "write latency" may be programmed to set a time, typically in number of clock periods tCK, between receipt of a write command by the memory and when the write data is provided to the memory. The latency may be programmed by a user of the memory to accommodate clock signals of different frequencies (i.e., different clock periods). Internal clock, data, and write command paths should be designed to provide propagation delays for the respective signals to account for the latency, for example, write latency between receipt of a write command and receipt of the write data for the write command. Other examples of commands that may require the correct timing of internal clock, data, and command signals for proper operation include, for example, read commands and on-die termination enable commands.

Complicating the generation of correctly timed internal clock, data, and write command signals is the relatively high-frequency of memory clock signals. For example, memory clock signals can exceed 1 GHz. Further complicating the matter is that multi-data rate memories may receive data at a rate higher than the memory clock signal. An example of a multi-data rate memory is one that receives write data at a rate twice that of the clock frequency, such as receiving write data synchronized with clock edges of the memory clock signal. The frequency of the memory clock signal may be the frequency at which write commands are executed. As a result, the timing domains of write command and clock signals may need to be crossed in order to maintain proper timing of the internal clock, data, and command signals.

An example conventional approach to maintaining the timing of internal write command, data, and clock signals is modeling both the clock and data path, and the write command path to have the same propagation delay. This may require, however, that delays and/or counter circuitry run continuously during memory operation. As a result, power consumption may be higher than desirable. Additionally, the propagation delay of the various internal clock, data, and command paths can often vary due to changes in power, voltage, and temperature conditions. For clock and write command paths having relatively long propagation delay or additional delay circuitry, the variations due to changing operating conditions may negatively affect the timing of the internal signals to such a degree that the memory does not operate properly.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
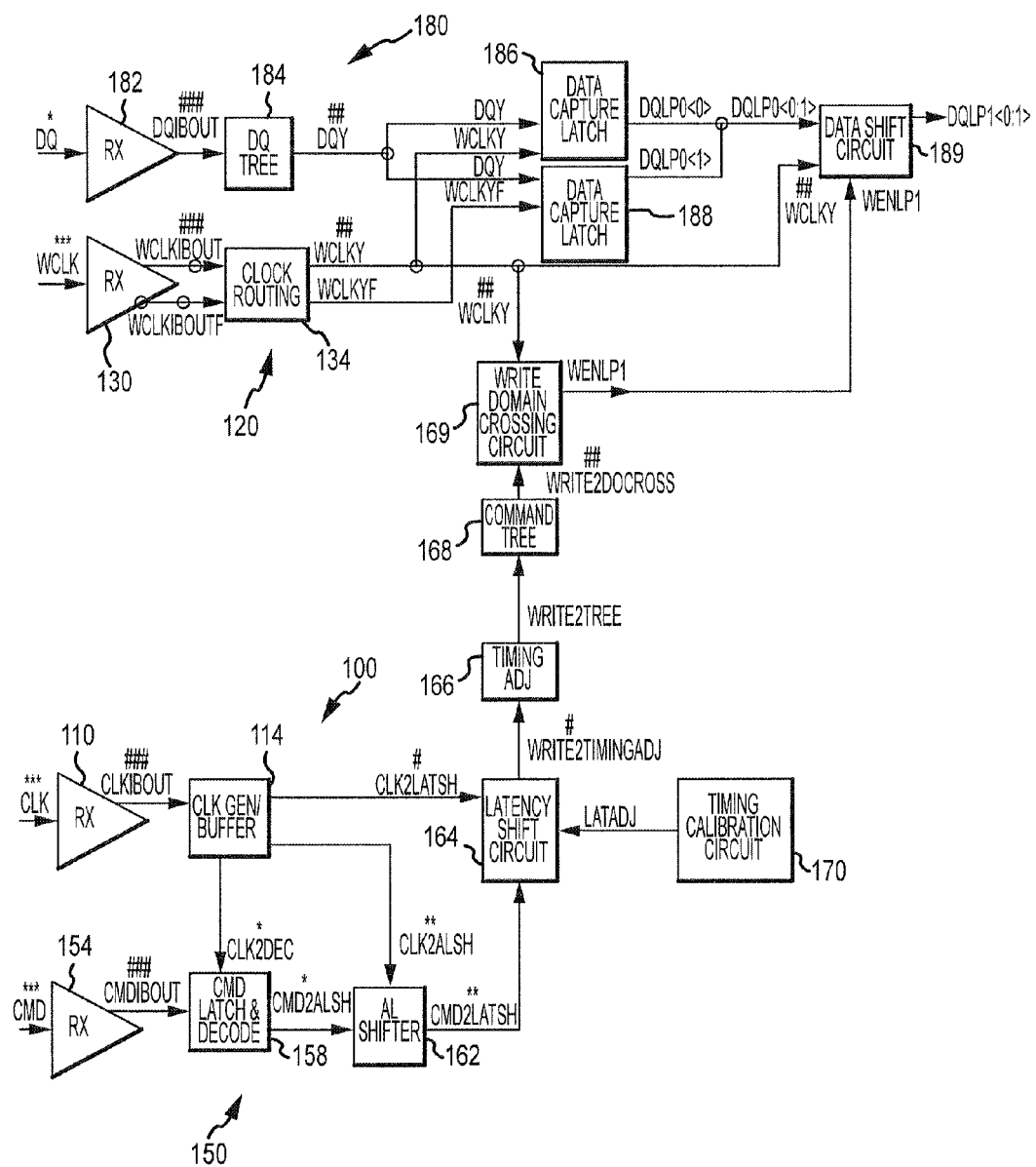
FIG. 1 is a block diagram of command and data paths according to an embodiment of the invention.

FIG. 1 illustrates an embodiment of command path 150 and data path 180 according to an embodiment of the invention. Although FIG. 1 is specifically described with reference to write commands and write data, other embodiments may include other examples of commands and data. FIG. 1 further illustrates a memory clock path 100 and clock path 120 which provide internal clock signals responsive to a memory clock CLK and write clock WCLK, respectively. The CLK and WCLK signals typically have the same clock frequency. Clock signals provided by the clock path 100 and clock path 120 may be used to clock circuits during operation of the command path 150 and the data path 180.

The clock path 100 includes a clock receiver 110 configured to receive a clock signal CLK and provide an output clock signal CLKIBOUT to a clock buffer 114. The clock receiver 110 may drive the signal levels of the CLK signal to a full clock signal voltage before providing the resulting CLKIBOUT signal to the clock buffer 114. The clock buffer 114 may be configured to buffer the CLKIBOUT signal and provide various output clock signals. For example, the clock buffer 114 provides output clock signals CLK2DEC and CLK2ALSH to the command path 150. The clock buffer 114 further provides output clock signal CLK2LATSH to the command path 150.

As known, electronic circuitry have inherent propagation delays which may result in signal delays as a signal is received and provided by the circuitry. For example, as the CLK signal propagates through the clock receiver 110 and clock buffer 114, the CLK2DEC, CLK2ALSH, and CLK2LATSH signals may have respective phases that are different than that of the CLK signal. Moreover, delay may be added in providing the CLK2DEC, CLK2ALSH, and CLK2LATSH signals so that the respective phases relative to the CLK signal are different from one another. For example, in some embodiments, delay may be added by the clock buffer 114 to the CLK2DEC signal in providing the CLK2ALSH signal. Further delay may be added to the CLK2ALSH signal in providing the CLK2LATSH signal. As a result, relative to the CLK signal, the CLK2DEC signal is the least delayed, the CLK2LATSH signal is the most delayed and the CLK2ALSH signal is delayed an intermediate delay.

The clock path 120 includes a clock receiver 130 configured to receive the write clock signal WCLK and provide output clock signals WCLKIBOUT and WCLKIBOUTF to clock routing 134. The WCLKIBOUTF signal is complementary to the WCLKIBOUT signal, and as a result, rising and falling clock edges of one of the signals substantially correspond to falling and rising clock edges, respectively, of the other signal. As with the clock receiver 110, the clock receiver 130 may drive the signal levels of the WCLK signal to a full clock signal voltage before providing the resulting WCLKIBOUT and WCLKIBOUTF signals to clock 134. Clock routing 134 may represent clock signal routing that is used to provide the WCLKIBOUT and WCLKIBOUTF signals through a memory to be used by other circuitry. For example, the WCLKIBOUT and WCLKIBOUTF signals may be routed by clock routing 134 to be provided as clock signals WCLKY and WCLKYF (the complement of the WCLKY signal) to circuitry of the data path 180 for use in capturing and shifting write data, as will be described in more detail below.

The data path 180 includes a data receiver 182 configured to receive write data DQ and provide write data DQIBOUT to data tree 184. The data tree 184 is configured to provide (e.g., distribute) the DQIBOUT write data as DQY write data to data capture latches 186, 188. The data capture latches 186, 188 latch the DQY write data responsive to the WCLKY and WCLKYF signals, respectively, and provide the latched data as DQLP0<0> and DQLP0<1> write data to a data shift circuit 189. For example, the data capture latch 186 latches the DQY write data and provides it as DQLP0<0> write data responsive to clock edges of the WCLKY signal (e.g., rising clock edges) to the data shift circuit 189. The data capture latch 188 latches the DQY write data and provides it as DQLP0<1> write data responsive to clock edges of the WCLKYF signal (e.g., rising clock edges, which correspond to falling clock edges of the WCLKY signal) to the data shift circuit 189. The data shift circuit 189 provides the DQLP0<0> and DQLP0<1> as DQLP1 write data responsive to the WCLKY signal. In general, the operation by the data capture latches 186, 188 and the data shift circuit 189 responsive to the WCLKY and WCLKYF signals provide a parallel-to-serial data operation. That is, write data (DQY) are latched in parallel at twice the frequency of the WCLK signal and provided as serial write data DQLP1 at the frequency of the WCLK signal, which has the same clock frequency as the CLK signal.

As will be described in more detail below, the DQ write data is provided to the data receiver 182 center-aligned with clock edges of the WCLK signal. The propagation delay through the data receiver 182 and the data tree 184 is approximately the same as the propagation delay through the clock receiver 130 and the clock routing 134. As a result, the DQY data provided by the data tree 184 remains substantially center-aligned with edges of the WCLKY (and the WCLKYF) signals provided by the clock routing 134.

The command path 150 may be configured to receive a write command CMD and provide an internal command signal to various circuitry for use during a write operation. The command path 150 has a command path delay. That is, the command path 150 takes a finite time, as known, to propagate a command signal to circuitry using the command. The command signal provided to the circuitry may be used, for example, to enable its operation. The command path 150 of FIG. 1 includes a command receiver 154 that is configured to receive the CMD and provide an output command signal CMDIBOUT to a command latch and decoder 158. The command latch and decoder 158 latches, decodes, and provides the CMDIBOUT signal responsive to the CLK2DEC signal from the clock buffer 114 of the clock path 100. That is, the command latch and decoder 158 provides decoded command signal CMD2ALSH to an additive latency (AL) shifter 162 responsive to the CLK2DEC signal. The AL shifter 162 is configured to shift the CMD2ALSH signal through it responsive to the CLK2ALSH signal from the clock buffer 114 of the clock path 100. The shifting adds clock cycles tCK of the CLK signal (by virtue of the CLK2ALSH signal) to provide additive latency to the propagation of the command signal through the command path 100. As known, AL may be added to accommodate the timing of internal operations of the memory and may be programmed (e.g., set) by a user or manufacturer, for example, by an additive latency value (typically in terms of the number of tCKs).

After the CMD2ALSH signal is shifted to provide the additive latency, it is provided by the AL shifter 162 as output command signal CMD2LATSH to latency shift circuit 164. The latency shift circuit 164 may provide a command signal WRITE2TIMINGADJ following a delay that is based at least in part on a shift count LATADJ provided by a timing calibration circuit 170. For example, in some embodiments, the latency shift circuit 164 provides a delay based at least in part on a difference between a write latency (e.g., programmed by a user) and a path delay difference measured in a number of tCKs by the timing calibration circuit 170. The path delay difference may be the delay difference between delays attributed to various circuits in the clock path 100 and command path 150 and a data path delay, as will also be described in more detail below.

The latency shift circuit 164 provides the WRITE2TIMINGADJ signal to a timing adjustment circuit 166 responsive to the CLK2LATSH signal from the clock buffer 114. Following a delay provided by the timing adjustment circuit 166, the WRITE2TIMINGADJ signal is provided as a command signal WRITE2TREE to a command tree 168. The command tree 168 is configured to provide (e.g., distribute) the WRITE2TREE signal as a command signal WRITE2DOCROSS to a domain crossing circuit 169. The WRITE2DOCROSS signal is latched by the domain crossing circuit 169 responsive to a clock edge of the WCLKY signal (e.g., a falling clock edge), and then provided as a command signal WENLP1 responsive to a following clock edge (e.g., a rising clock edge). The WENLP1 signal may be used, for example, to enable operation of the data shift circuit 189 such that unless an active WENLP1 signal is provided to the data shift circuit 189, DQLP0 write data will not be shifted out as DQLP1 write data responsive to the WCLKY signal.

As previously described, the timing adjustment circuit 166 may add delay to the WRITE2TIMINGADJ signal in providing the WRITE2TREE signal. The timing adjustment circuit 166 may add delay, for example, to align command signals to provide timing margin and to accommodate changes in the delay through the clock path 100, for example, changes that affect the timing of clock signals of the clock path 100. In some embodiments, the delay added by the timing adjustment circuit 166 may be used to align rising clock edges of the WRITE2DOCROSS signal provided by the tree 168 with rising edges of the WCLKY signal from clock routing 134. This may improve timing margin for latching the WRITE2DOCROSS signal and providing the WENLP1 signal by the domain crossing circuit 169. For example, where the WRITE2DOCROSS signal has a signal width of approximately one tCK (i.e., one period of the CLK signal), a falling clock edge of the WCLKY signal will be substantially aligned with the center of the WRITE2DOCROSS signal thereby providing a timing margin of approximately one-half tCK to latch the WRITEDOCROSS signal. Responsive to a following rising edge of the WCLKY signal the latched WRITEDOCROSS signal is latched and a WENLP1 signal is provided by the domain crossing circuit 169 to the data shift circuit 189 in response.

For convenience, the signals previously discussed that have common phases are identified by common phase symbols in FIG. 1. For example, the CLK, CMD, and WCLK signals are generally "in phase," as represented by having the common phase symbol of "***". In another example, DQY, WCLKY, WRITE2DOCROSS signals are also generally in phase, as represented by the common phase symbol "##".

Figure 2:
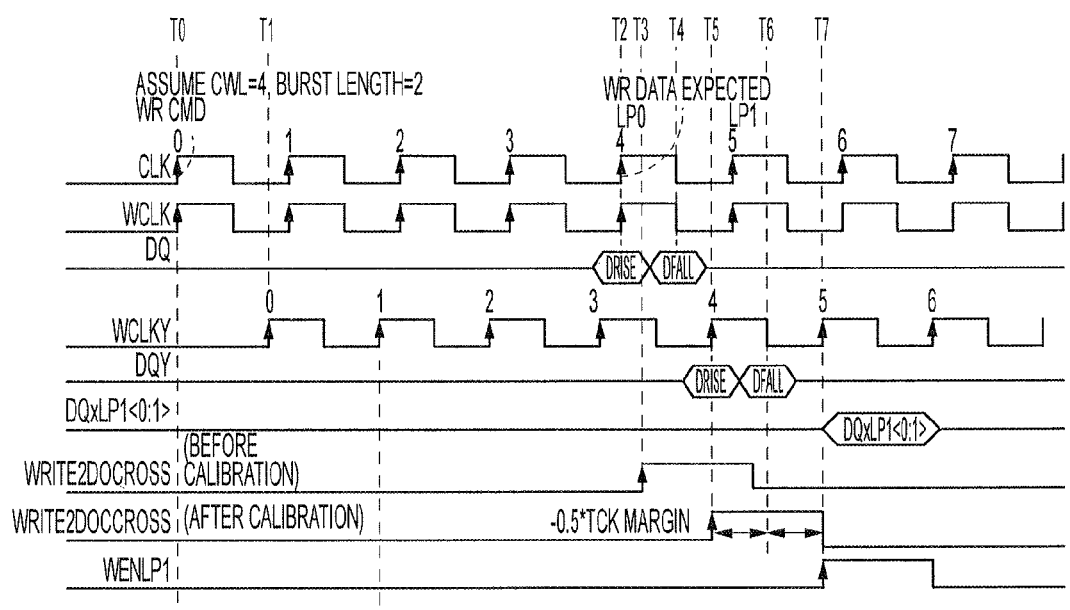
FIG. 2 illustrates a timing diagram of various signals during operation of command and data paths according to an embodiment of the invention.

Operation of the command path 150 and data path 180 of FIG. 1 will be described with reference to the timing diagram of FIG. 2. FIG. 2 illustrates various signals during operation of the command and data paths according to an embodiment of the invention. In the example of FIG. 2, a write latency of 4 tCKs and a burst length of 2 is assumed. That is, write data is provided 4 tCKs after a write command is provided to the memory and the write data includes two portions of data.

Further assumed for the example of FIG. 2 is that the shift count provided to the latency shift circuit 164 is LATADJ=2. The shift count LATADJ may be, for example, the difference between the write latency (e.g., 4 tCKs) and an estimated path delay difference of the command path 150 and the data path 180 measured in terms of tCKs. In the following example, the estimated path delay difference is 2 tCKs. As previously discussed, the command path 150 is configured to propagate the CMD signal to be used in a write operation while taking into account the write latency.

At time T0 a write command CMD provided to the command receiver 154 is latched responsive to a rising edge of the CLK signal provided to the clock receiver 110. In particular, the CMD is provided by the command receiver 154 as the CMDIBOUT signal to the command latch and decoder 158. The rising edge of the CLK signal at time T0 propagates through the clock receiver 110 and is provided to the clock buffer 114. The CLK2DEC signal provided by the clock buffer 114 responsive to the CLK signal clocks the command latch and decoder 158 to latch the CMDIBOUT signal and provide a CMD2ALSH signal representative of the write command at time T0. The CMD2ALSH signal is provided to the AL shifter 162 which adds latency to the propagation of the CMD2ALSH signal through the command path 150. The CMD2ALSH signal is provided as the CMD2LATSH signal to the latency shift circuit 164 responsive to the CLK2ALSH signal from the clock buffer 114 after the latency is added by the AL shifter 162.

Turning for the moment to the write clock signal WCLK and write data DQ provided to the clock path 120 and data path 180, respectively, as illustrated in FIG. 2 the WCLK signal provided to the clock receiver 130 is in phase with the CLK signal. With the write latency set to 4 tCKs, the write data is provided to the data receiver 182 center-aligned with the fourth rising clock edge of the WCLK (and CLK) signals following the latching of CMD, that is, at time T2. With a burst length of 2, two different portions of write data associated with the write command CMD are provided. The first portion of write data is provided at the rising edge of the WCLK signal (at time T2) and the second portion is provided at the falling edge of the WCLK signal (at time T4).

The WCLK signal propagates through the clock receiver 130 and is provided as complementary clock signals WCLKIBOUT and WCLKIBOUTF to clock routing 134, which provides the WCLKIBOUT and WCLKIBOUTF clock signals as the WCLKY and WCLKYF clock signals to the data capture latches 186, 188. The propagation delay of the clock receiver 130 and clock routing 134 is illustrated in FIG. 2 as the time difference between time T0 and T1. The write data DQ (from times T2 and T4) propagate through the data receiver 182 and are provided to the data tree 184 as DQIBOUT write data. The data tree 184 distributes the DQIBOUT write data as the DQY write data to the data capture latches 186, 188. As previously discussed, the propagation delay through the data receiver 182 and the data tree 184 is approximately the same as the propagation delay through the clock receiver 130 and the clock routing 134. As a result, the center-alignment of the DQ write data and the clock edges of the WCLK signal is generally maintained with the timing of the DQY write data and the WCLKY signal (and WCLKYF signal). FIG. 2 illustrates this by the rising and falling clock edges of the WCLKY signal (and WCLKYF signal) at times T5 and T6 center-aligned with the DQY write data.

The rising clock edge of the WCLKY signal clocks the data capture latch 186 at time T5 to latch the first DQY write data (i.e., corresponding to the DQ write data at time T2) and provide the same as DQLP0<0> write data to the data shift circuit 189. The rising clock edge of the WCLKYF signal (corresponding to the falling clock edge of the WCLKY signal) clocks the data capture latch 188 at time T6 to latch the second DQY write data (i.e., corresponding to the DQ write data at time T4) and provide the same as DQLP0<1> write data to the data shift circuit 189. By providing the first and second DQY write data in sequence during one tCK to be latched in parallel allows the data shift circuit 189 to provide the DQLP1 write data in parallel at the frequency of the WCLK signal.

Returning to the propagation of the CMD signal provided at time T0 through the command path 150, a shift count LATADJ provided by the timing calibration circuit 170 is used by the latency shift circuit 164 to add a number of clock cycles (tCK) to the path delay of the command path 150. In the example of FIG. 2, as previously described, LATADJ=2. As a result, the latency shift circuit 164 shifts the CMD2ALSH signal (i.e., the CMD2ALSH signal corresponding to the CMD provided to the command receiver 154 at time T0) two tCKs responsive to the CLK2LATSH signal before providing the WRITE2TIMINGADJ signal to the timing adjustment circuit 166.

The timing adjustment circuit 166 adds delay to the WRITE2TIMINGADJ signal to provide the WRITE2TREE signal. The WRITE2TREE signal is distributed by the command tree 168 as the WRITE2DOCROSS signal to a domain crossing circuit 169. The timing adjustment circuit 166, as previously discussed, adds delay to the command path 150, for example, to center-align the WRITE2DOCROSS signal with a clock edge of the WCLKY signal which may improve timing margin (e.g., provide one-half tCK timing margin). The delay added by the timing adjustment circuit 166 is illustrated in FIG. 2 as a difference between times T3 and T5.

That is, the clock edge of the WRITE2DOCROSS signal at time T3 represents the timing of the WRITE2DOCROSS signal provided by the command tree 168 without added delay from the timing adjustment circuit 166. The WRITE2DOCROSS signal having a clock edge at time T5, however, represents the timing of the WRITE2DOCROSS signal including delay added by the timing adjustment circuit 166. As illustrated in FIG. 2, the added delay center-aligns the WRITE2DOCROSS signal with a clock edge (e.g., a falling clock edge) of the WCLKY signal, thus providing approximately one-half tCK timing margin for the latching of the WRITE2DOCROSS signal by the domain crossing circuit 169 responsive to the falling clock edge of the WCLKY signal, such as the falling clock edge at time T6.

Responsive to the latching of the WRITE2DOCROSS signal by the WCLKY signal at time T6, the WENLP1 command signal is provided to enable the data shift circuit 189 at the time the DQLP0 write data is provided to the data shift circuit 189. With the data shift circuit 189 enabled, the rising edge of the WCLKY signal at time T7 clocks the data shift circuit 189 to latch the DQLP0 write data and provide the same as DQLP1 write data to be written to memory. As illustrated by the previous example, the command path 150 is configured to receive a write command CMD and provide it for use in a write operation while taking into account write latency. That is, the write command is provided to circuitry used during the write operation with the appropriate timing relative to the receipt of the write command CMD and receipt of the write data DQ.

Figure 3:
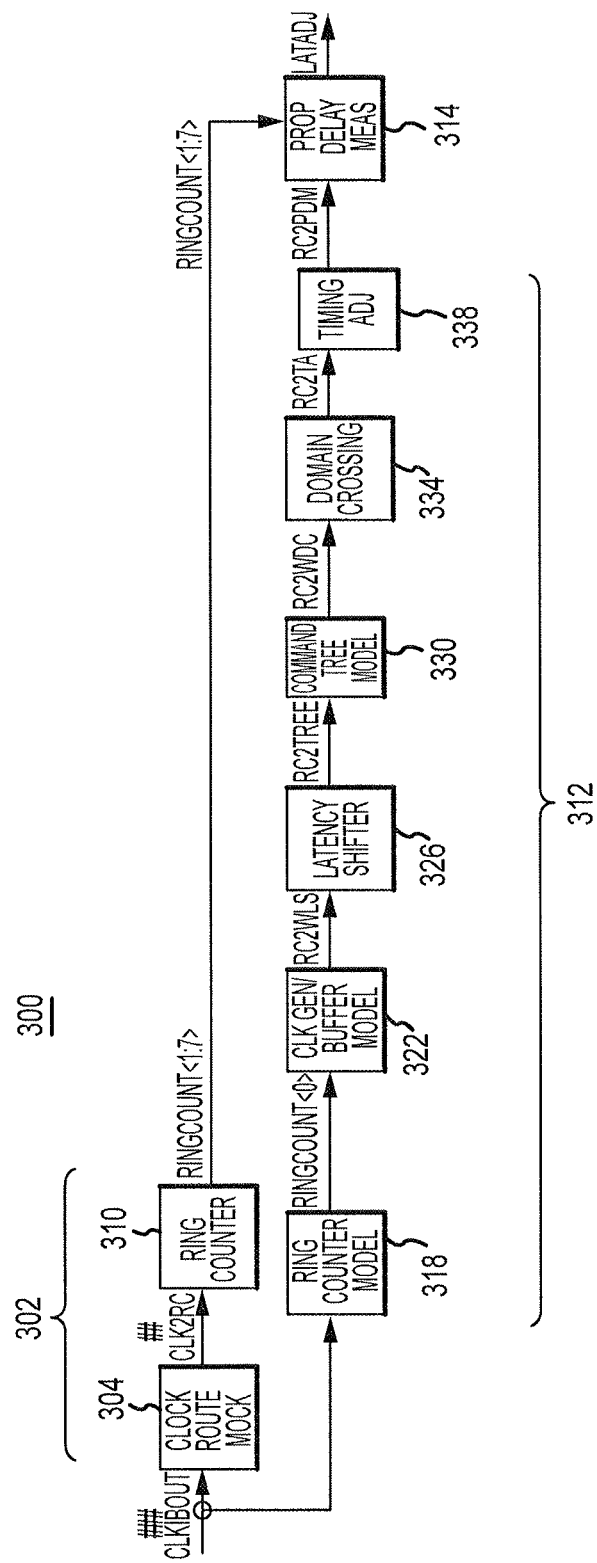
FIG. 3 is a block diagram of a timing calibration circuit according to an embodiment of the invention.

FIG. 3 illustrates a timing calibration circuit 300 according to an embodiment of the invention. In some embodiments, the timing calibration circuit 300 may be used for the timing calibration circuit 170 of FIG. 1. The timing calibration circuit 300 provides a LATADJ shift count in a number of tCKs a latency shift circuit, for example, latency shift circuit 164, should delay providing a WRITE2TIMINGADJ signal to the timing adjustment circuit 166 responsive to receiving a CMD2LATSH signal.

The LATADJ shift count is based at least in part on the number of tCKs of path delay difference of various circuits in the clock path 100 and command path 150 and the data path delay. For example, in the embodiment of the timing calibration circuit 300 of FIG. 3, a LATADJ shift count is equal to the difference between a write latency value and the number of tCKs of path delay difference between (1) path delay 312 and (2) path delay 302. The path delay 312 models the propagation delay through the latency shift circuit 164, timing adjustment circuit 166, command tree 168, and the domain crossing circuit 169, with consideration of propagation delay of the clock buffer 114 in providing the CLK2LATSH signal for clocking the latency shift circuit. The path delay 302 models the propagation delay through clock routing 134 (or data tree 184 which may have substantially the same propagation delay as the clock routing 134). The blocks in the timing calibration circuit in the embodiment of FIG. 3 of path delays 302, 312 are included because the propagation delay through the blocks represents a minimum asynchronous path delay of the write command CMD from input through to the data shift circuit 189 (ignoring propagation delays that are experienced by both the CMD and the write data DQ, for example, receiver propagation delay), and a minimum asynchronous path delay of the write data DQ from input through to the data shift circuit 189.

The path delay 302 of the timing calibration circuit 300 includes a clock routing model delay 304 which has a propagation delay substantially similar to the clock routing model delay 134 (or the data tree 184). The clock routing model delay 304 is configured to receive the CLKIBOUT signal and provide a WCLKY signal to a ring counter 310 that provides a first ring count RINGCOUNT<1:7>. The RINGCOUNT<1:7> represents a 7-bit value including the seven most significant bits of an 8-bit ring count generated by the ring counter 310 responsive to the WCLKY signal. The RINGCOUNT<1:7> value is provided to a propagation delay measurement circuit 314. The propagation delay measurement circuit 314 is configured to calculate the LATADJ shift count in terms of a number of tCKs that represents a difference between a write latency value and the difference between the path delay 312 and path delay 302.

The path delay 312 includes a ring counter 318 that generates a second ring count RINGCOUNT<0> responsive to the CLKIBOUT signal. The RINGCOUNT<0> ring count represents a 1-bit value that is the least significant bit of the ring count generated by the ring counter 318. The RINGCOUNT<0> signal is provided through model delay blocks 322-338 to provide a RC2PDM signal to the propagation delay measurement circuit 314. The model delay blocks 322-338 of the embodiment of FIG. 3 include clock buffer model delay 318, latency shift circuit model delay 326, command tree model delay 330, domain crossing circuit model delay 334, and timing adjustment circuit model delay 338. The resulting RC2PDM signal has a delay relative to the RINGCOUNT<0> signal that models the propagation delay of the clock buffer 114, latency shift circuit 164, command tree 168, domain crossing circuit 169, and timing adjustment circuit 166.

Although the timing calibration circuit 300 of FIG. 3 illustrates particular blocks of model delays, other embodiments of a timing calibration circuit may include greater or fewer model delays. For example, in some embodiments of a timing calibration circuit. Some of the model delays described with reference to FIG. 3 may not be included, such as a model delay that models propagation delay of the latency shift circuit. In some embodiments, a model delay included in a timing calibration circuit may have a different delay than the corresponding block of the clock or command paths which it is modeling. For example, the latency shift circuit model delay 326 may have a longer delay than the latency shift circuit 164. In this manner, the propagation delay of another block of the clock or command paths which does not have a corresponding model delay in the timing calibration circuit 300 may be considered in the calculation by the timing calibration circuit.

Figure 4:
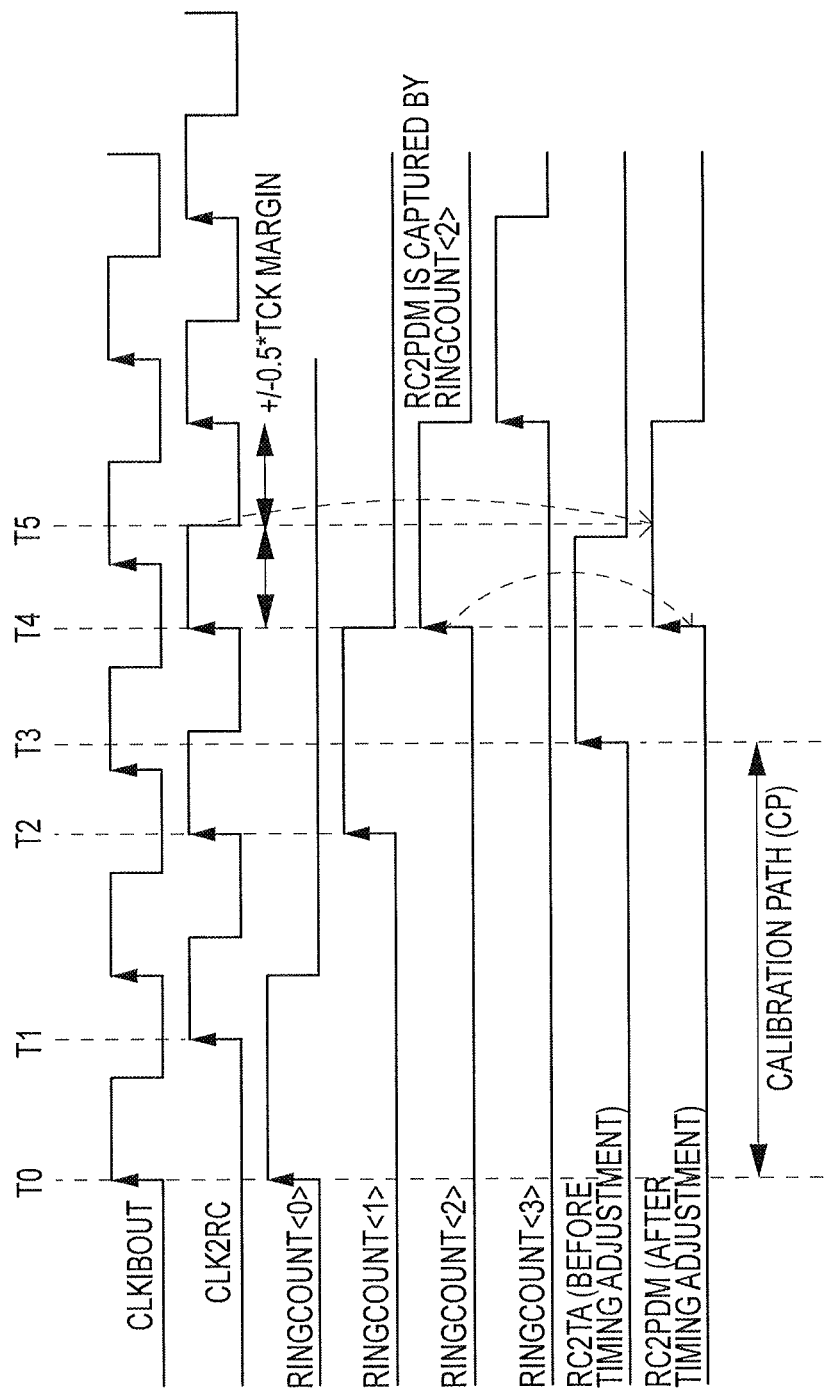
FIG. 4 is a timing diagram of various signals during operation of a timing calibration circuit according to an embodiment of the invention.

FIG. 4 illustrates a timing diagram of various signals during operation of the timing calibration circuit 300 according to an embodiment of the invention. At time T0, the ring counter 318 begins generating the RINGCOUNT<0> responsive to a rising clock edge of the CLKIBOUT signal, as illustrated in FIG. 4 by the leading clock edge of RINGCOUNT<0>. At time T1, the CLKIBOUT signal is provided by the clock routing model delay 304 to the ring counter 310 as CLK2RC. The propagation delay of the clock routing model delay 304 is represented by the time between times T0 and T1. The ring counter 310 is configured to generate a sequence of RINGCOUNT<1:7> signals where each succeeding RINGCOUNT signal has a rising clock edge corresponding to a falling clock edge of the previous RINGCOUNT signal. For example, as illustrated in FIG. 4, at time T2 the RINGCOUNT<1> signal has a rising clock edge that corresponds to a falling clock edge of a RINGCOUNT<0> signal that is generated by the ring counter 310, but not included in the RINGCOUNT<1:7> count nor shown in FIG. 4. A RINGCOUNT<2> signal has a rising clock edge at time T4 that corresponds to a falling clock edge of RING- COUNT<1>. To begin the sequence of the RINGCOUNT signals again, the RINGCOUNT<0> signal will have a next rising clock edge corresponding to a falling clock edge of the last RINGCOUNT signal, and each succeeding RING-COUNT signal will transition as previously described.

With reference to FIG. 4, at time T3, the rising clock edge of RINGCOUNT<0> signal has propagated through model delays 322-334 and is provided as the RC2TA signal to the timing adjustment model delay 338. As previously described, the timing adjustment circuit 166 of the command path 150 adds delay, for example, to align command signals to provide timing margin during operation. The timing adjustment model delay 338 may be set to provide the same additional delay as the timing adjustment circuit 166. As illustrated in FIG. 4, the timing adjustment model delay 338 provides a RC2PDM signal having a rising clock edge at time T4 which represents the rising edge of the RC2TA signal at time T3 with delay added by the timing adjustment model delay 338. As a result, one-half tCK of timing margin is provided with respect to the falling clock edge of the WCLKY signal at time T5. The delay between times T3 and T4 of FIG. 4 represents the additional delay added by the timing adjustment model delay 338. The time from T0 to T4 represents the minimum asynchronous path delay through the command path 150 used for the LATADJ calculation. The RINGCOUNT<1:7> signals and the RC2PDM signal are provided to the propagation delay measurement circuit 314 for calculation of the LATADJ shift count.

In determining the LATADJ shift count, the propagation delay measurement circuit 314 uses RINGCOUNT<1:7> signals to determine the number of tCKs of delay through the model delay path 312. For example, with reference to FIG. 4, the path delay 312 has a path delay of two tCKs as illustrated by the rising clock edge of the RC2PDM signal corresponding to the rising clock edge of the RINGCOUNT<2> signal at time T4. As a result, in the previously described example the path delay used in calculating the LATADJ shift count is 2 tCKs. In some embodiments, the number of tCKs of path delay may be a next higher whole number for any fractional tCK of delay through the model delay path 312. The additional delay provided by the timing adjustment model delay 338 (mirroring additional delay of the timing adjustment circuit 166) may result in the alignment of the RC2PDM signal with one of the RINGCOUNT<1:7> signals, as illustrated in FIG. 4 by the rising edges off the RC2PDM and RINGCOUNT<2> signals at time T5.

Figure 5:
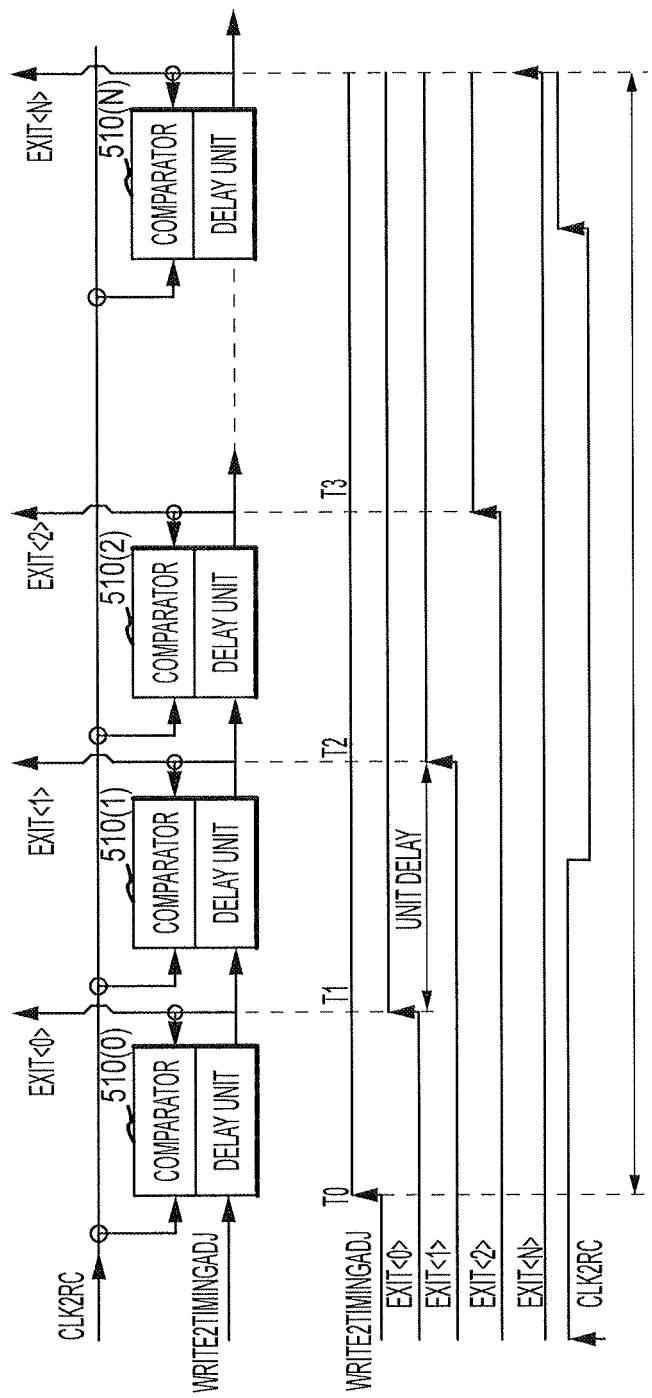
FIG. 5 is a block diagram of a timing adjustment circuit according to an embodiment of the invention.

FIG. 5 illustrates a timing adjustment circuit 500 according to an embodiment of the invention, and a timing diagram of various signals during operation of the same. The timing adjustment circuit 500 may be used for the timing adjustment circuit 166 (FIG. 1). The timing adjustment circuit 500 is configured to determine an amount of additive delay to add to a path delay of the command path 150, for example, to center align a WRITE2DOCROSS command signal with a clock edge (e.g., a falling clock edge) of the WCLKY signal that is used to clock the domain crossing circuit 169. As previously discussed, the additive delay provided by the timing adjustment circuit 500 (i.e., timing adjustment circuit 166) may be mirrored by a timing adjustment circuit model delay in a timing calibration circuit 170, for example, timing adjustment circuit model delay 338 of timing calibration circuit 300 of FIG. 3.

The timing adjustment circuit 500 includes a plurality of unit delays and comparators 510(0)-510(n) that may be used to selectively add delay to the command path 150. For example, in the embodiment illustrated in FIG. 5, the additive delay is added to the WRITE2TIMINGADJ signal provided by the latency shift circuit 164 (FIG. 1) of the command path 150 in units of unit delay. The length of delay of the unit delays are typically one tCK or less (i.e., one clock period of the CLK signal) so that sufficient delay resolution is provided by the incremental delay added by a unit delay. In some embodiments, the number of unit delays and comparators 510(0)-510(n) is based at least in part on providing a total delay that is approximately equal to the slowest tCK at a fastest operating condition for the memory in which the timing and adjustment circuit 500 is included. In a particular example, the maximum delay of the timing adjustment circuit 500 is 5 ns, and includes 30 unit delays and comparators 510, each unit delay providing approximately 225 ps of delay.

The selection of the number of unit delays to add to the path delay is made at least in part through the use of the comparators of the unit delays and comparators 510(0)-510(n). The comparators are configured to compare the CLK2RC signal and the delayed WRITE2TIMINGADJ signal provided by the respective unit delay. For example, in some embodiments of the invention, the comparator that detects a transition of the CLK2RC signal (e.g., a falling clock edge) is the comparator of the unit delay and comparators 510 that is selected as the last unit delay added by the timing adjustment circuit 500 to the path delay of the command path 150.

An example of the operation of the timing and adjustment circuit 500 will be described with reference to the timing diagram of FIG. 5. The timing diagram of FIG. 5 illustrates a leading clock edge (i.e., a rising clock edge) of the WRITE2TIMINGADJ signal at time T0 input to a first unit delay and comparator 510(0). The delayed WRITE2TIMINGADJ signal provided by the unit delay and comparator 510(0) is illustrated by the delayed rising clock edge at time T1 provided by the unit delay and comparator 510(1). The further delayed WRITE2TIMINGADJ signal is illustrated as well, and has a rising clock edge provided by the unit delay and comparator 510(2) at time T3. As illustrated in example of FIG. 5, the CLK2RC signal, which is provided to the unit delays and comparators 510(0)-510(n), has a falling clock edge that is detected by the unit delay and comparator 510(1). As a result, the unit delay and comparator 510(1) represents the last unit delay to be added to the WRITE2TIMINGADJ signal (i.e., add two unit delays) by the timing adjustment circuit 500 before being provided as the WRITE2TREE signal.

Figure 6:
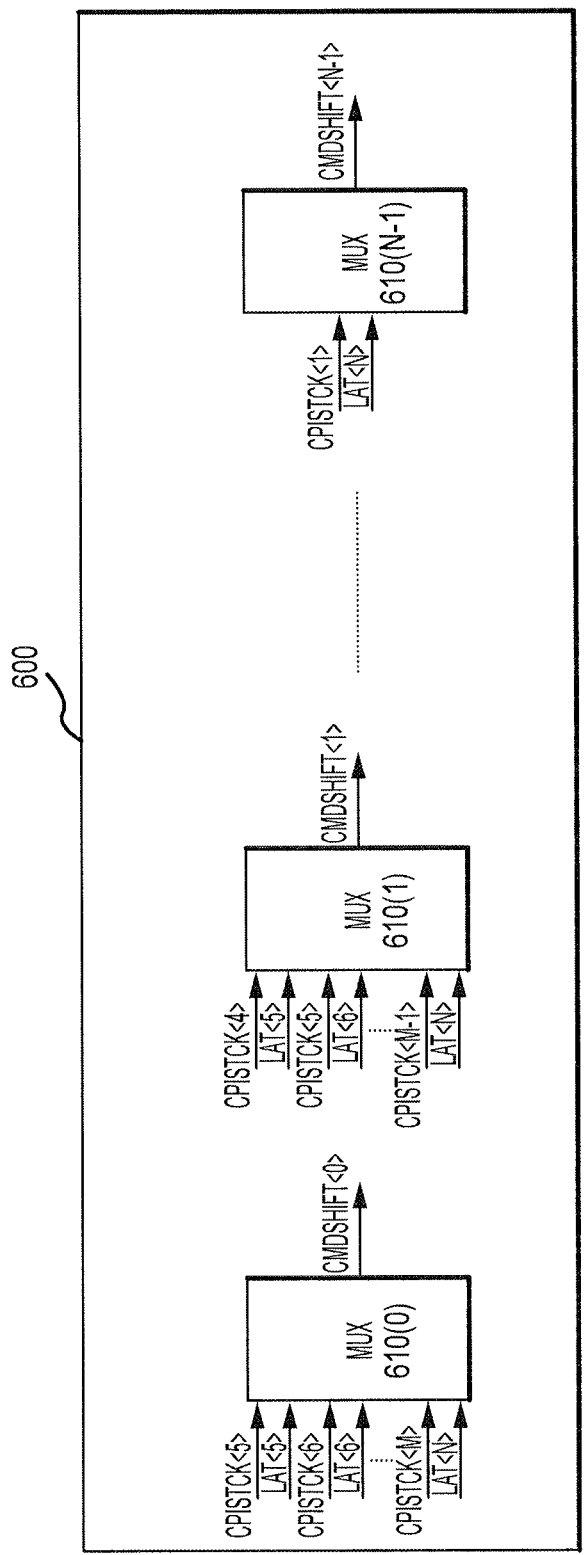
FIG. 6 is a block diagram of a shift adjustment circuit according to an embodiment of the invention.

FIG. 6 illustrates logic 600 included in a propagation delay measurement circuit according to an embodiment of the invention. The logic 600 may be, for example, included in the propagation delay measurement circuit 314 (FIG. 3). The logic 600 includes a plurality of logic circuits 610(0)-610(n−1). Each of the logic circuits 610 receive signals LAT<n> indicative of the write latency value "n" for the memory, as well as signals CPIstCK<m> indicative of the number "m" of tCKs of delay based on, for example, the path delays 302, 312. A shift count CMDSHIFT<n−m> based at least in part on the LAT<n> and CPIstCK<m> signals is determined by the logic circuits 610. The CMDSHIFT<n−m> shift count is provided to the latency shift circuit command circuit 164 as the LATADJ shift count to be used in setting the number of tCKs the CMD2LATSH signal is delayed before being provided to the timing adjustment circuit 166 as the WRITE2TIMINGADJ signal.

In operation, in the embodiment of FIG. 6 each of the logic circuits 610 compares pairs of LAT<n> and CPIstCK<m> signals to determine if a true condition exits. The logic circuit 610 that determines a true condition of one of its LAT<n>-CPIstCK<m> pairs provides its respective CMDSHIFT<n−m> shift count. For example, the logic circuit 610(0) receives LAT<n>-CPIstCK<m> pairs of LAT<5>-CPIstCK<5>, LAT<6>-CPIstCK<6>, . . . LAT<n>-CPIstCK<m>. The logic circuit 610(0) will provide a CMDSHIFT<0> signal indicating a LATADJ of zero tCKs (i.e., the CMD2LATSH signals are not shifted by any tCKs before being provided) when any of the LAT<n>-CPIstCK<m> signals it receives is true. For example, if the latency value is 5 and the delay through the model delay paths is 5 tCKs; if the latency value is 6 and the delay through the model delay paths is 6 tCKs; and if the latency value is n and the delay through the model delay paths is m tCKs, where n=m the CMDSHIFT<0> signal will be provided as the LATADJ shift count. The LAT<n>-CPIstCK<m> signal pairs provided to the logic circuit 610(1) are different combinations where (n−m)=1. Although not expressly illustrated in FIG. 6, additional logic circuits 610 are included for different combinations of (n−m), for example, (n−m)=2, (n−m)=3, until (n−m)=(n−1). As a result, the logic circuits 610 of the logic 600 may provide CMDSHIFT signals over a range of zero through (n−m) tCKs to set the latency shift circuit 164 to add delay between zero tCKs through (n−m) tCKs to the CMD2LATSH signals.

Figure 7:
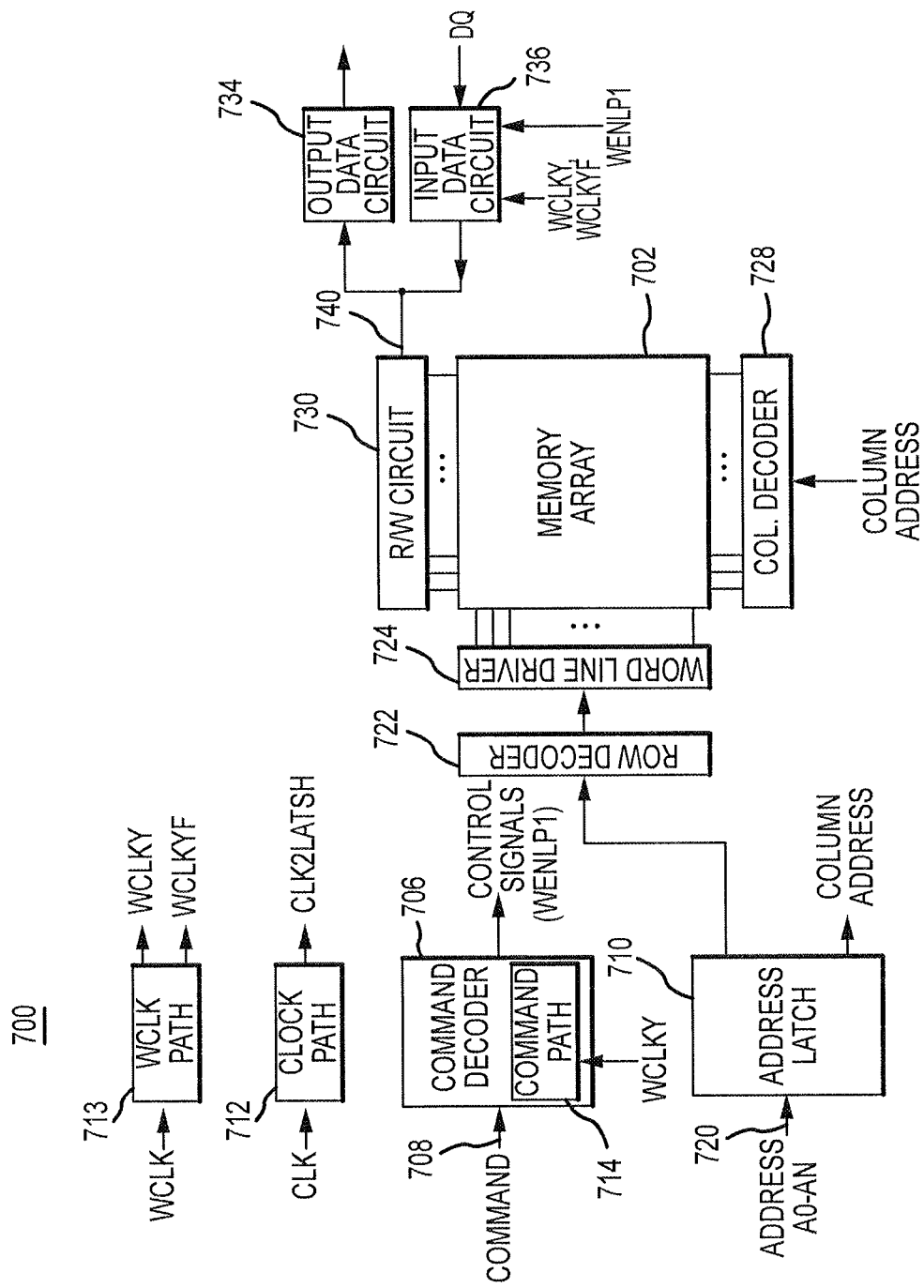
FIG. 7 is a block diagram of a memory including command and data paths according to an embodiment of the invention.

FIG. 7 illustrates a portion of a memory 700 according to an embodiment of the present invention. The memory 700 includes an array 702 of memory cells, which may be, for example, DRAM memory cells, SRAM memory cells, flash memory cells, or some other types of memory cells. The memory 700 includes a command decoder 706 that receives memory commands through a command bus 708 and generates corresponding control signals within the memory 700 to carry out various memory operations. Row and column address signals are applied to the memory 700 through an address bus 720 and provided to an address latch 710. The address latch then provides a separate column address and a separate row address.

The memory 700 further includes clock path 712, a clock path 713, and command path 714. The clock path 712 receives a input clock signal CLK and propagates the internal clock signal CLK2LATSH, which is based at least in part on the CLK signal, to the command path 714. The clock path 713 receives a write clock signal WCLK and provides internal write clock signal WCLKY, WCLKYF, which are based at least in part on the WCLK signal, to the command path 714 and the input data circuit 736. The command path 714 may be implemented using a command path according to an embodiment of the invention. The command path 714, which is shown in FIG. 7 as being included in the command decoder 706, but is not limited to such a configuration, provides the internal command signal WENLP1 to the input data circuit 736. The command decoder 706 responds to memory commands applied to the command bus 708 to perform various operations on the memory array 702. In particular, the command decoder 706 is used to generate internal control signals to read data from and write data to the memory array 702.

The row and column addresses are provided by the address latch 710 to a row address decoder 722 and a column address decoder 728, respectively. The column address decoder 728 selects bit lines extending through the array 702 corresponding to respective column addresses. The row address decoder 722 is connected to word line driver 724 that activates respective rows of memory cells in the array 702 corresponding to received row addresses. The selected data line (e.g., a bit line or bit lines) corresponding to a received column address are coupled to a read/write circuitry 730 to provide read data to an output data circuit 734 via an input-output data bus 740. Write data are applied to the memory array 702 through the input data circuit 736 and the memory array read/write circuitry 730. The input data circuit 736 may include clocked circuitry that operate responsive to an internal write clock signals WCLKY, WCLKYF and an internal command signal WENLP1, for example.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A command path, comprising:
   a command receiver configured to receive a command and provide an internal command signal;
   a latency shift circuit coupled to the command receiver to receive the internal command signal, the latency shift circuit configured to add a delay in providing the internal command signal responsive to a clock signal, the delay based at least in part on a shift count; and
   a timing calibration circuit coupled to the latency shift circuit and configured to provide the shift count, the shift count based at least in part on a latency and a modeled path delay of the command path.

2. The command path of claim 1, wherein the timing calibration circuit comprises:
   a model delay path configured to model a path delay of at least a portion of the command path;
   a ring counter configured to provide a ring count; and
   a propagation delay measurement circuit coupled to the model delay path and the ring counter, the propagation delay measurement circuit configured to determine the modeled path delay of the command path and provide the shift count to the latency shift circuit.

3. The command path of claim 2, wherein the propagation delay measurement circuit comprises:
   a plurality of logic circuits, each of the logic circuits configured to compare signals indicative of the latency value and signals indicative of the modeled path delay and determine a shift count therefrom.

4. The command path of claim 1, further comprising:
   a timing adjustment circuit coupled to the latency shift circuit and configured to receive the internal command signal from the latency shift circuit and delay the same by a timing adjustment delay to center-align the internal command signal with a clock edge of an internal clock signal or a clock signal that is in phase with the internal clock signal.

5. The command path of claim 1, further comprising:
   a timing adjustment circuit coupled to the latency shift circuit and configured to receive the internal command signal from the latency shift circuit and delay the same by a timing adjustment delay to align the internal command signal with a clock signal that is in phase with the internal clock signal.

6. The command path of claim 4, wherein the timing adjustment circuit comprises:
   a plurality of series coupled unit delays and comparators, each of the unit delays and comparators configured to receive the internal clock signal and detect a clock edge of the same, each of the unit delays and comparators configured to delay the internal command by a unit delay.

7. The command path of claim 1, further comprising:
   a domain crossing circuit coupled to the latency shift circuit and configured to latch the internal command responsive to an internal clock signal and further configured to provide a data shift circuit enable signal responsive to the internal clock signal.

8. The command path of claim 1, further comprising:
a timing adjustment circuit coupled to the latency shift circuit and configured to receive the internal command signal from the latency shift circuit and delay the same by timing adjustment delay to center-align the internal command signal with a clock edge of an internal clock signal;
a command tree coupled to the timing adjustment circuit and configured to provide the internal command signal; and
a domain crossing circuit coupled to command tree and configured to latch the internal command from the command tree responsive to an internal clock signal, the domain crossing circuit further configured to provide a data shift circuit enable signal responsive to the internal clock signal.

9. The command path of claim 7, wherein the timing calibration circuit comprises:
a model delay path configured to model a path delay of at least a portion of the command path, the model delay path including model delays for the timing adjustment circuit, the command tree, and the domain crossing circuit.

10. The command path of claim 1, wherein the internal command signal has a signal width of one clock period.

11. The command path of claim 1, wherein the shift count provided to the latency shift circuit represents a number of clock periods of the clock signal.

12. A memory, comprising:
a command receiver configured to receive a command and provide an internal command signal;
a latency shift circuit coupled to the command receiver to receive the internal command signal, the latency shift circuit configured to add a delay in providing the internal command signal responsive to a clock signal, the delay based at least in part on a shift count;
a timing calibration circuit coupled to the latency shift circuit and configured to proved the shift count, the shift count based at least in part on a latency and a modeled path delay of the command path;
a clock path configured to receive a clock signal and responsive thereto provide the internal clock signal; and
a data path coupled to the clock path, the data path configured to receive data and provide the same for writing to a memory responsive to the internal clock signal.

13. The memory of claim 12, wherein the data path comprises a data shift circuit configured to provide the data for writing to the memory responsive to the internal clock signal and a data shift circuit enable signal, and the memory further comprises:
a domain crossing circuit coupled to the latency shift circuit and configured to latch the internal command responsive to the internal clock signal and further configured to provide the data shift circuit enable signal responsive to the internal clock signal.

14. A method for providing an internal command to a data path, the method comprising:
receiving a command;
propagating the command through a command path to provide an internal command;
receiving data;
propagating the data through a data path;
determining a difference between a latency value and a path delay difference, the path delay difference representing a modeled path delay difference between the command path and the data path measured in terms of a number of clock periods;
delaying the propagation of the command through the command path to the data path by a delay based at least in part on the difference between the latency value and the path delay difference; and
providing the internal command to the data path responsive to an internal clock signal.

15. The method of claim 14, further comprising:
adding propagation delay to the command path to center-align the internal command with a clock edge of the internal clock signal.

16. The method of claim 14, further comprising:
receiving a memory clock signal;
propagating the memory clock signal through a clock path to provide an internal memory clock signal; and
wherein delaying the propagation of the command through the command path comprises:
shifting the command responsive to the internal memory clock signal to add a number of clock periods of the memory clock signal equal to the difference between a latency value and a path delay difference.

17. The method of claim 14, wherein determining a difference between a latency value and a path delay difference comprises:
modeling a command path delay of the command path;
modeling a data path delay of the data path; and
determining a whole number of clock periods representing the difference between the modeled command path delay and the modeled data path delay.

18. The method of claim 17, wherein modeling a command path delay comprises:
modeling propagation delays of a timing adjustment circuit, a command tree, and a domain crossing circuit included in the command path.

19. The method of claim 14, wherein propagating data through the data path comprises:
latching data in parallel responsive to first and second clock edges a clock signal; and
providing the latched data serially responsive to the first clock edge of the clock signal.

20. The method of claim 19, wherein providing the internal command to the data path responsive to an internal clock signal comprises providing the internal command to the data path having a timing relative to the latching of the data to enable providing the latched data in parallel.

* * * * *